(12) United States Patent
Jang et al.

(10) Patent No.: US 7,884,659 B2
(45) Date of Patent: Feb. 8, 2011

(54) PHASE MIXER AND DELAY LOCKED LOOP INCLUDING THE SAME

(75) Inventors: Jae-Min Jang, Gyeonggi-do (KR);
Yong-Ju Kim, Gyeonggi-do (KR);
Sung-Woo Han, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Hae-Rang Choi, Gyeonggi-do (KR);
Ji-Wang Lee, Gyeonggi-do (KR);
Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 22 days.

(21) Appl. No.: 12/347,298

(22) Filed: Dec. 31, 2008

(65) Prior Publication Data
US 2010/0164571 A1    Jul. 1, 2010

(30) Foreign Application Priority Data
Dec. 26, 2008  (KR) ...................... 10-2008-0134635

(51) Int. Cl.
*H03K 11/16*  (2006.01)
(52) U.S. Cl. .................. 327/231; 327/234; 327/262; 327/513
(58) Field of Classification Search .................. None
See application file for complete search history.

(56) References Cited

U.S. PATENT DOCUMENTS

| | | | |
|---|---|---|---|
| 5,241,286 A * | 8/1993 | Mirow | 331/108 B |
| 6,445,238 B1 * | 9/2002 | Lesea | 327/262 |
| 6,476,653 B1 | 11/2002 | Matsuzaki | |
| 6,504,408 B1 | 1/2003 | von Kaenel | |
| 6,906,567 B2 * | 6/2005 | Culler | 327/170 |
| 7,068,084 B2 | 6/2006 | Byun et al. | |
| 7,154,322 B2 * | 12/2006 | Kim | 327/276 |
| 7,449,936 B2 * | 11/2008 | Shin et al. | 327/378 |
| 7,519,844 B2 * | 4/2009 | Kizer et al. | 713/400 |
| 2004/0124896 A1 | 7/2004 | Byun et al. | |
| 2007/0132493 A1 | 6/2007 | Fujisawa et al. | |

FOREIGN PATENT DOCUMENTS

| | | |
|---|---|---|
| JP | 11-86545 | 3/1999 |
| JP | 2001-159999 | 6/2001 |
| JP | 2004-032070 | 1/2004 |
| JP | 2004-145709 | 5/2004 |
| KR | 100605588 | 7/2006 |
| KR | 100795004 | 1/2008 |

OTHER PUBLICATIONS

Notice of Preliminary Rejection issued from Korean Intellectual Property Office on Oct. 25, 2010.

* cited by examiner

*Primary Examiner*—An T Luu
(74) *Attorney, Agent, or Firm*—IP & T Group LLP

(57) ABSTRACT

A phase mixer includes a phase mixing unit configured to mix a phase of a first input signal and a phase of a second input signal in response to a phase control signal and output a phase mixed signal whose phase is varied by one or more units of a unit phase value, and a phase value adjusting unit configured to control an operation of the phrase mixing unit so that the unit phase value is adjusted in response to a code signal coding at least one of a process, voltage, or temperature (PVT) variation.

17 Claims, 10 Drawing Sheets

PHASE MIXER AND DELAY LOCKED LOOP INCLUDING THE SAME

CROSS-REFERENCE TO RELATED APPLICATIONS

The present invention claims priority of Korean patent application number 10-2008-0134635, filed on Dec. 26, 2008, which is incorporated by reference in its entirety.

BACKGROUND OF THE INVENTION

The present invention relates to a phase mixer and a delay locked loop including the same, and more particularly, to a phase mixer operating according to PVT variation and a delay locked loop including the same.

FIG. 1 is a circuit diagram of a conventional phase mixer 100.

Referring to FIG. 1, the phase mixer 100 includes first driving units 101 to 103 receiving a first input signal IN_1, and second driving units 104 to 106 receiving a second input signal IN_2. The phase mixer 100 mixes a phase of the first input signal IN_1 and a phase of the second input signal IN_2 to output a phase mixed signal MIX_OUT.

The phase mixer 100 mixes the phase of the first input signal IN_1 and the phase of the second input signal IN_2 by driving the first input signal IN_1 and the second input signal IN_2 with different driving strengths in response to phase control signals PH_CTRL<1:K>. The first and second driving units 101 to 106 may be implemented with inverters. The first and second driving units 101 to 106 are enabled or disabled in response to the phase control signals PH_CTRL<1:K>. As the number of the driving units enabled in response to the phase control signals PH_CTRL<1:K> increases, the first input signal IN_1 and the second input signal IN_2 are driven more strongly. The phase of the phase mixed signal MIX_OUT becomes close to the phase of one of the first and second input signals IN_1 and IN_2 which is driven more strongly. For example, if the first input signal IN_1 is driven more strongly than the second input signal IN_2, a phase difference between the phase mixed signal MIX_OUT and the first input signal IN_1 is smaller than that between the phase mixed signal MIX_OUT and the second input signal IN_2.

Meanwhile, since the first and second driving units 101 to 106 invert the first and second input signals IN_1 and IN_2, the phase mixed signal MIX_OUT need not be inputted to an inverter (not shown). Bubbles of the second driving units 104 to 106 receiving the phase control signals PH_CTRL<1:K> indicate the inversion.

The phase mixer 100 is used to eliminate skew between signals in a delay locked loop (DLL), a duty cycle corrector (DCC), a clock data recovery circuit, and so on. A delay locked loop including the phase mixer 100 of FIG. 1 will be described below with reference to FIG. 2.

FIG. 2 is a block diagram of a conventional delay locked loop including the phase mixer 100 of FIG. 1.

Referring to FIG. 2, the delay locked loop includes a phase comparator 201, a delay line 203, and a replica model 205.

The phase comparator 201 compares a phase of an external clock EXT_CLK with a phase of a feedback clock FB_CLK outputted from the replica model 205 and outputs a comparison signal CMP containing information on a phase difference between the external clock EXT_CLK and the feedback clock FB_CLK. The replica model 205 replicates or models process, voltage, and/or temperature (PVT) variations of clock delay components of a semiconductor device, and receives an internal clock CLK_OUT to output the feedback clock FB_CLK based on the PVT variations. For example, the replica model 205 may include components having same physical characteristics as the components of the semiconductor device and may receive the same external supply voltage and ground as the components of the semiconductor device. The delay line 203 outputs the internal clock CLK_OUT by delaying the external clock EXT_CLK in response to the comparison signal CMP in order to reduce the phase difference between the external clock EXT_CLK and the feedback clock FB_CLK. The clock is locked when the phase difference between the external clock EXT_CLK and the feedback clock FB_CLK cannot be further reduced.

The delay line 203 includes a plurality of delay units (not shown) and the phase mixer 100 of FIG. 1. The plurality of delay units delay the input signal by a unit delay value UNIT_DD through each delay unit. The delay unit 203 delays the external clock EXT_CLK by using the plurality of delay units to output a first coarse delay clock COARSE_CLK1 and a second coarse delay clock COARSE_CLK2. A phase difference corresponding to the unit delay value UNIT_DD exists between the first coarse delay clock COARSE_CLK1 and the second coarse delay clock COARSE_CLK2.

The phase mixer 100 mixes a phase of the first coarse delay clock COARSE_CLK1 and a phase of the second coarse delay clock COARSE_CLK2 to output the internal clock CLK_OUT whose phase is varied by a delay corresponding to one or more units of a unit phase value PH_VALUE. The unit phase value PH_Value of a clock may be a delay in phase (or in time) of a clock signal in relation to another clock signal such as a delay in phase of one of the first coarse delay clock COARSE_CLK1 and the second coarse delay clock COARSE_CLK2 to the other one. The unit phase value PH_VALUE is smaller than the unit delay value UNIT_DD, which is a delay of the external clock EXT_CLK through each delay unit of the delay line 203, and the phase mixer 100 can finely adjust the phase difference between the external clock EXT_CLK and the feedback clock FB_CLK.

FIG. 3 is a timing diagram for explaining a delay operation of the delay line of FIG. 2.

Referring to FIG. 3, each of the delay units delays the external clock EXT_CLK to output the first coarse delay clock COARSE_CLK1 and the second coarse delay clock COARSE_CLK2 having the phase difference corresponding to the unit delay value UNIT_DD. The phase mixer 100 mixes the phase of the first coarse delay clock COARSE_CLK1 and the phase of the second coarse delay clock COARSE_CLK2 to output the internal clock CLK_OUT whose phase is finely varied by one or more of the unit phase value PH_VALUE.

Meanwhile, as described above, the phase of the internal clock CLK_OUT is finely varied according to the different driving strengths for the first coarse delay clock COARSE_CLK1 and the second coarse delay clock COARSE_CLK2. The driving strengths for the first coarse delay clock COARSE_CLK1 and the second coarse delay clock COARSE_CLK2 are changed according to the number of the driving units provided in the phase mixer 100. Thus, the unit phase value PH_VALUE for finely varying the phases of the first coarse delay clock COARSE_CLK1 and the second coarse delay clock COARSE_CLK2 is determined by the phase difference between the first coarse delay clock COARSE_CLK1 and the second coarse delay clock COARSE_CLK2, that is, a ratio of the unit delay value UNIT_DD to the number of the driving units provided in the phase mixer 100. For example, the unit phase value PH_VALUE is 1 if the unit delay value UNIT_DD is 3 and the number of the first driving units provided in the phase mixer 100 is 3 prior to process/voltage/temperature (PVT) variation. Units of the delay value and the phase value are omitted, and number representing the delay value and the phase value represents magnitude of the delay value and the phase value.

Meanwhile, if the PVT is varied, the unit delay value UNIT_DD may be changed. For example, when a driving voltage of the delay unit of the delay line 203 drops down, the unit delay value UNIT_DD of each delay unit increases. Therefore, as illustrated, the unit phase value PH_VALUE increases. For example, when the unit delay value UNIT_DD increases from 3 to 6, the unit phase value PH_VALUE increases to 2 because the number of the first and second driving units 101 to 106 is constant.

If the unit delay value UNIT_DD increases due to the PVT variation, the unit phase value PH_VALUE also increases. Thus, the phase difference between the external clock EXT_CLK and the feedback clock FB_CLK is adjusted based on the increased unit phase value PH_VALUE. Consequently, after locking, the phase difference between the external clock EXT_CLK and the feedback clock FB_CLK is also varied, that is, increased with the increase of the unit delay value UNIT_DD and the unit delay value PH_VALUE. The increase in the phase difference between the external clock EXT_CLK and the feedback clock FB_CLK means increase of jitter.

Consequently, if the phase difference between the first input signal IN_1 and the second input signal IN_2 increases due to the PVT variation, the conventional phase mixer 100 outputs the phase mixed signal MIX_OUT whose phase is varied by the increased unit phase value PH_VALUE, leading to increase of jitter. The above problems may arise in the delay locked loop of FIG. 2 or duty cycle corrector employing the phase mixer 100.

SUMMARY OF THE INVENTION

Embodiments of the present invention are directed to provide a phase mixer, which is capable of preventing increase of jitters even though PVT is varied, and a delay locked loop including the same.

In accordance with an aspect of the present invention, there is provided a phase mixer, which includes a phase mixing unit configured to mix a phase of a first input signal and a phase of a second input signal in response to a phase control signal and output a phase mixed signal whose phase is varied by one or more units of a unit phase value, and a phase value adjusting unit configured to control an operation of the phrase mixing unit so that the unit phase value is adjusted in response to a code signal coding at least one of a process, voltage, or temperature (PVT) variation.

In accordance with another aspect of the present invention, there is provided a delay locked loop, which includes a phase comparator configured to compare a phase of an external clock with a phase of a feedback clock to output a comparison signal, a delay line configured to output an internal clock by delaying the external clock in response to the comparison signal, a replica model configured to receive the internal clock to output the feedback clock, and a phase value adjuster configured to control an operation of the delay line so that the delay value of the delay line is adjusted in response to a code signal coding a process, voltage, and temperature (PVT) variation.

In accordance with further aspect of the present invention, there is provided a delay locked loop, which includes a delay locking unit configured to delay an input clock by one or more units of a unit delay value in order to compensate for a skew between an external clock and an internal clock, and a delay value adjusting unit configured to adjust the unit delay value at a desired value according to a code signal coding at least one of a process, voltage, and temperature (PVT) variation.

DESCRIPTION OF SPECIFIC EMBODIMENTS

Other objects and advantages of the present invention can be understood by the following description, and become apparent with reference to the embodiments of the present invention.

Figure 1:
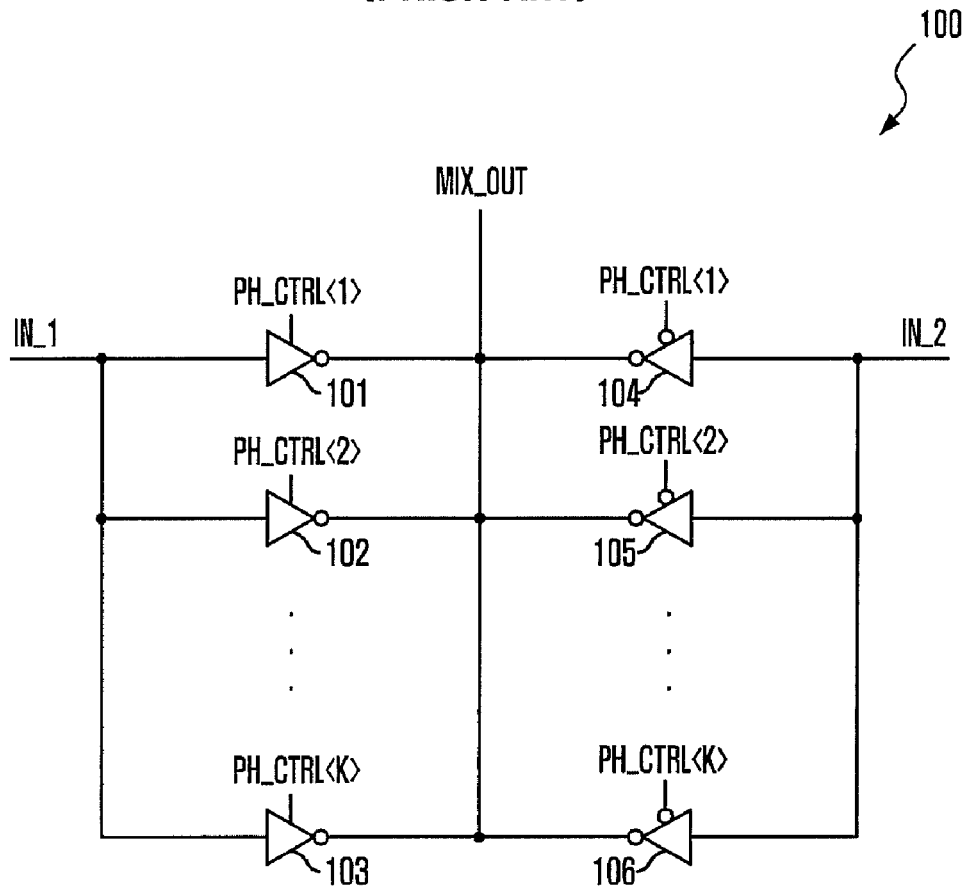
FIG. 1 is a circuit diagram of a conventional phase mixer 100.
Figure 2:
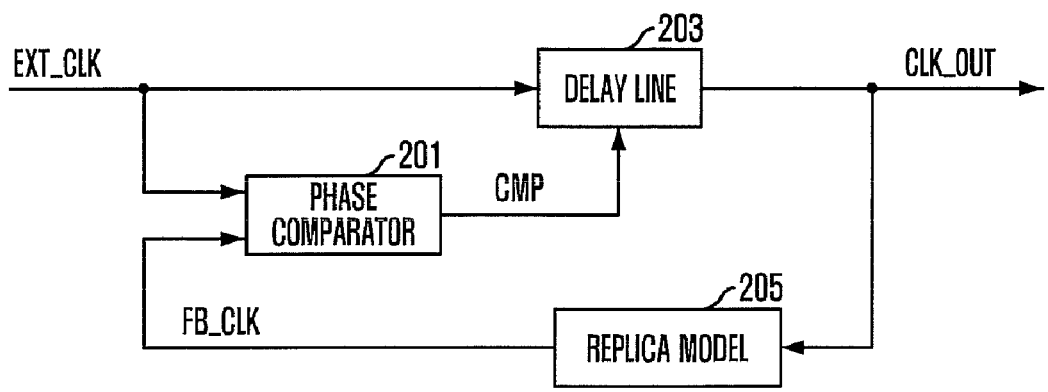
FIG. 2 is a block diagram of a conventional delay locked loop including the phase mixer 100 of FIG. 1.
Figure 3:
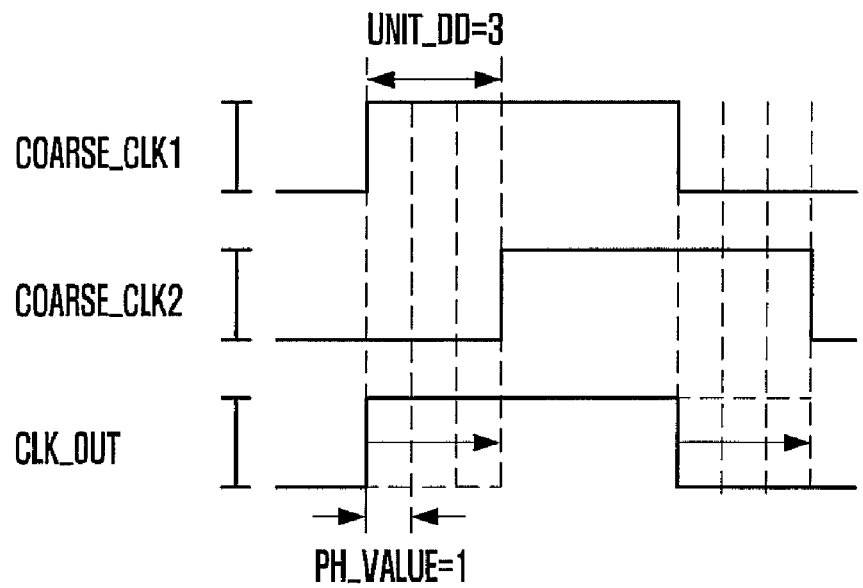
FIG. 3 is a timing diagram for explaining a delay operation of a delay line 203 of FIG. 2.
Figure 3:
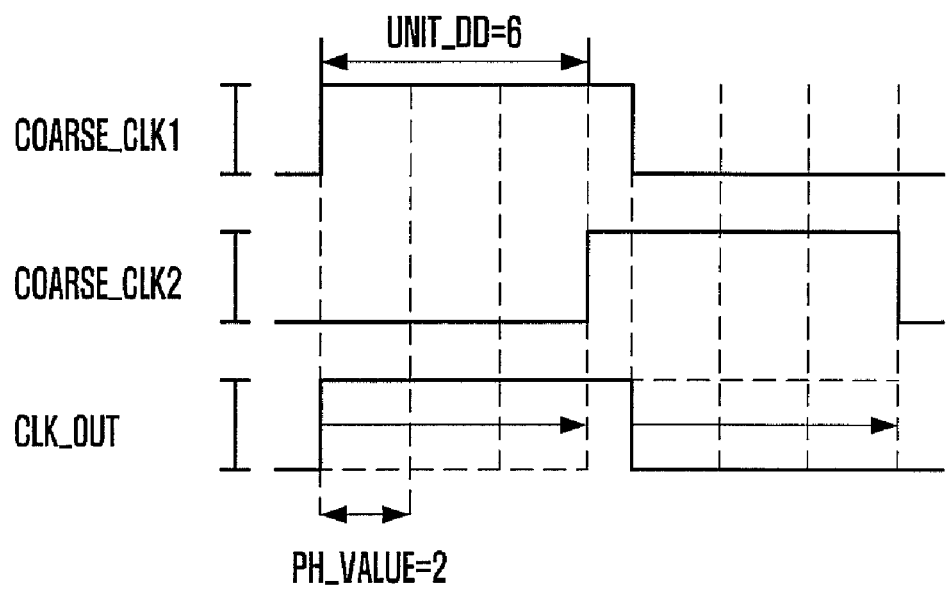
Figure 4:
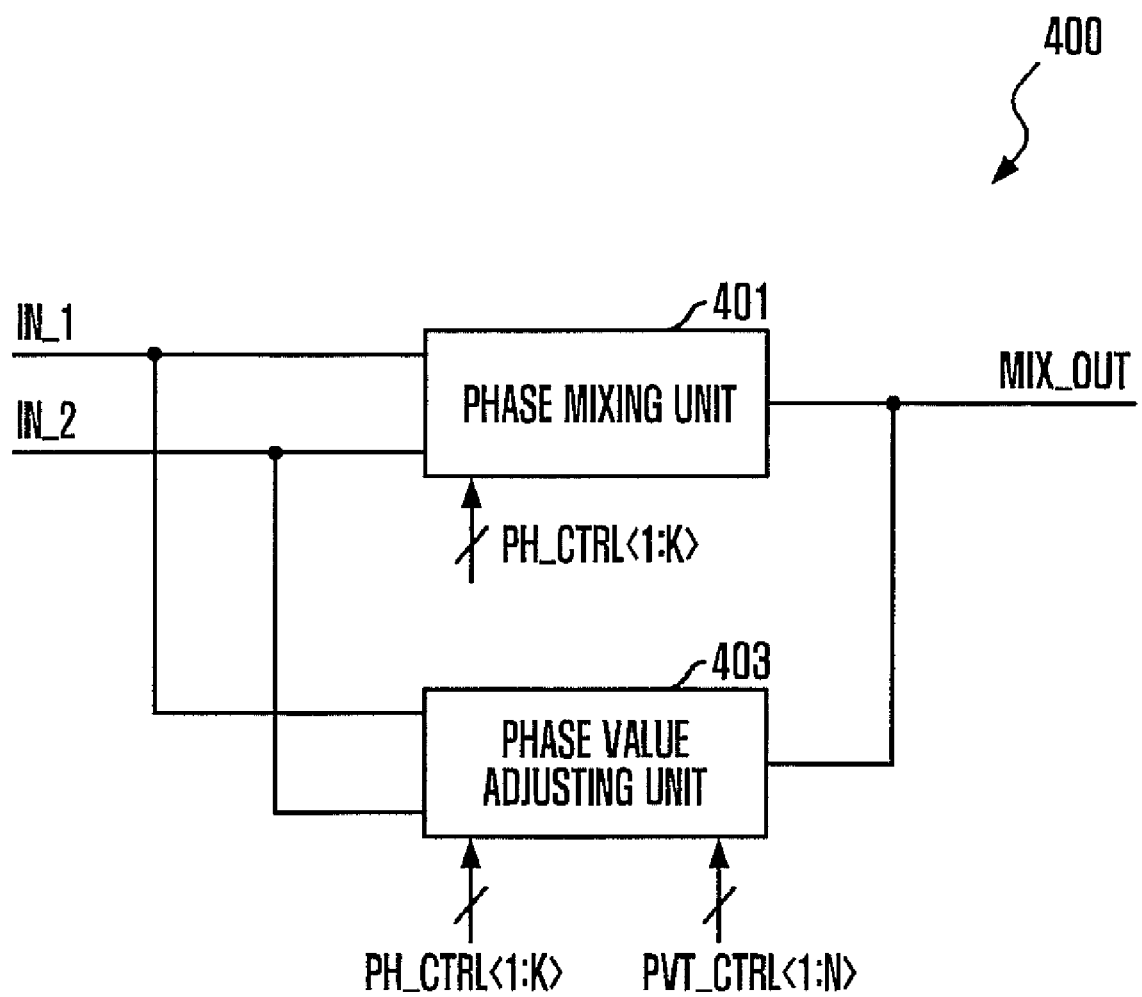
FIG. 4 is a block diagram of a phase mixer 400 in accordance with an embodiment of the present invention.

FIG. 4 is a block diagram of a phase mixer 400 in accordance with an embodiment of the present invention.

Referring to FIG. 4, the phase mixer 400 includes a phase mixing unit 401 and a phase value adjusting unit 403.

The phase mixing unit 401 adjusts drive strengths for a first input signal IN_1 and a second input signal IN_2 in response to phase control signals PH_CTRL<1:K>, and mixes a phase of the first input signal IN_1 and a phase of the second input signal IN_2 to output a phase mixed signal MIX_OUT whose phase is varied by a unit phase value PH_VALUE. The first input signal IN_1 and the second input signal IN_2 may be a first coarse delay clock COARSE_CLK1 and a second coarse delay clock COARSE_CLK2. A phase difference corresponding to a unit delay value UNIT_DD exists between the first coarse delay clock COARSE_CLK1 and the second coarse delay clock COARSE_CLK2.

Meanwhile, if the phase difference between the first input signal IN_1 and the second input signal IN_2 increases, the unit phase value PH_VALUE would tend to also increase. The unit phase value PH_VALUE of a clock may be a delay in phase (or in time) of a clock signal in relation to another clock signal such as a delay in phase of one of the first coarse delay clock COARSE_CLK1 and the second coarse delay clock COARSE_CLK2 to the other one. At this point, the phase value adjusting unit 403 adjusts the phase value PH_VALUE in response to PVT code signals PVT_CTRL<1:N> containing PVT variation information. That is, if the phase difference between the first input signal IN_1 and the second input signal IN_2 increases due to PVT variation, the phase value adjusting unit 403 additionally adjusts driving strengths for the first input signal IN_1 and the second input signal IN_2 in response to the phase control signals PH_CTRL<1:K> according to the PVT code signals PVT_CTRL<1:N>. Thus, the increase of the unit phase value PH_VALUE can be prevented. The process of additionally adjusting the driving strengths for the first input signal IN_1 and the second input signal IN_2 at the phase value adjusting unit 403 will be described in detail with reference to FIG. 6.

In accordance with the embodiment of the present invention, even though the phase difference between the first input signal IN_1 and the second input signal IN_2 increases due to the PVT variation, the unit phase value PH_VALUE is maintained at an originally intended value, thus making it possible to output the phase mixed signal MIX_OUT whose phase is varied by the originally intended unit phase value PH_VALUE. Therefore, the increase of jitter can be prevented, even though PVT is varied.

The PVT code signals PVT_CTRL<1:N> may be ZQ calibration code signals. The ZQ calibration code signals are generated by a ZQ calibration circuit and are varied according to PVT variation. That is, the ZQ calibration code signals contain PVT variation information. The relationship between the PVT variation and the ZQ calibration code signals will be described below.

Figure 5:
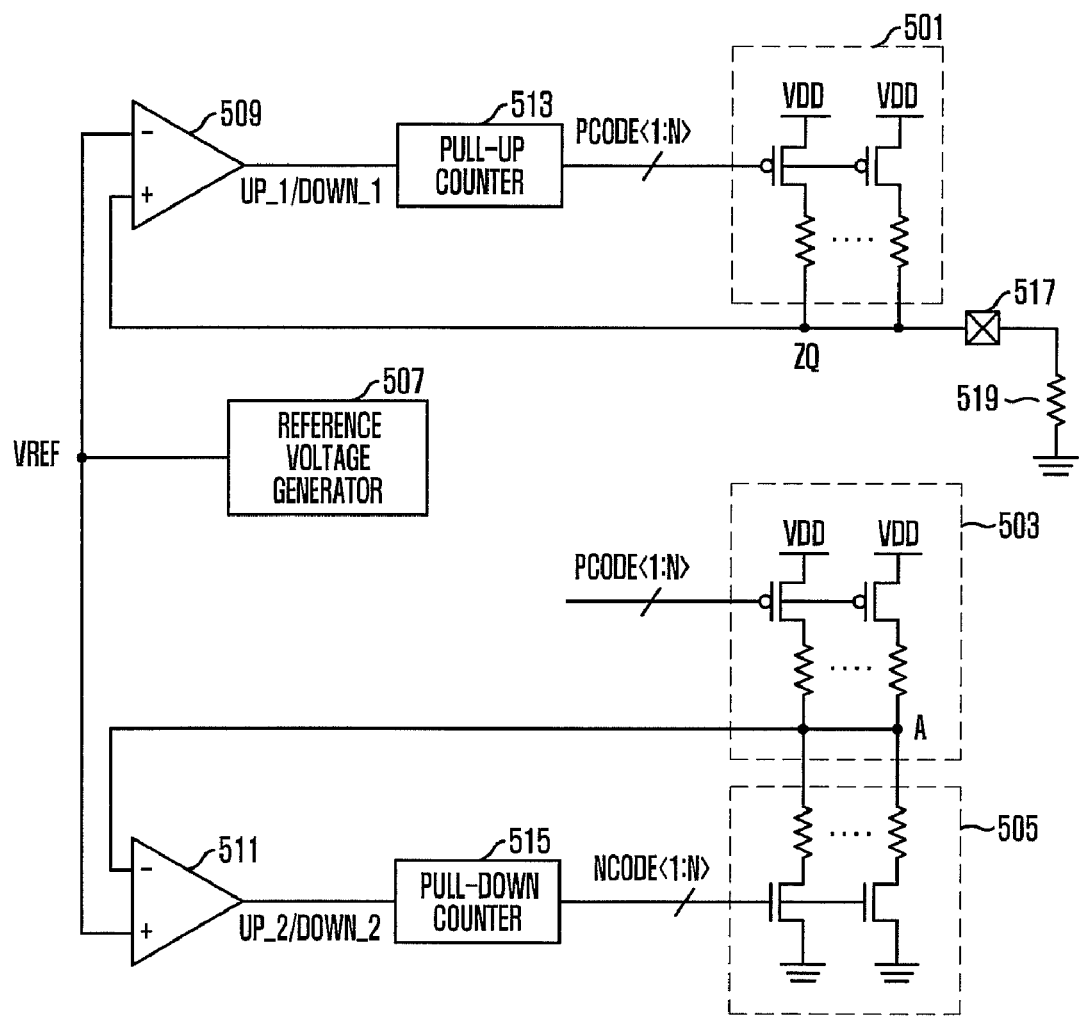
FIG. 5 is a circuit diagram of a ZQ calibration circuit generating ZQ calibration code signals.

FIG. 5 is a circuit diagram of a ZQ calibration circuit which is employed in a semiconductor device and generates the ZQ calibration code signals. The ZQ calibration code signals may include pull-up code signals PCODE<1:L> and pull-down code signals NCODE<1:L>. The PVT code signals PVT_CTRL<1:N> may be one of the pull-up code signals PCODE<1:L> and pull-down code signals NCODE<1:L>

Referring to FIG. 5, the ZQ calibration circuit includes a first pull-up resistor unit 501, a second pull-up resistor unit 503, a pull-down resistor unit 505, a reference voltage generator 507, comparators 509 and 511, a pull-up counter 513 (e.g., a logic circuit), and a pull-down counter 515.

A reference resistor 519 is connected to a ZQ pad 517 of the semiconductor device, and the reference resistor 519 and the first pull-up resistor unit 501 are connected in parallel at a node ZQ. The comparator 509 generates an up signal or a down signal, UP_1 and DOWN_1, respectively, by comparing a voltage of the node ZQ with a reference voltage VREF generated from the reference voltage generator 507. The reference voltage generator 507 generates the constant reference voltage VREF without influence of PVT variation.

The pull-up counter 513 generates pull-up code signals PCODE<1:L> in response to the up/down signal UP_1/DOWN_1. The first pull-up resistor unit 501 adjusts the voltage of the node ZQ in response to the pull-up code signals PCODE<1:L>. That is, as corresponding transistors of a plurality of pull-up resistors of the first pull-up resistor unit 501 are selectively turned on/off according to the pull-up code signals PCODE<1:L>, a total resistance of the first pull-up resistor unit 501 is adjusted. The voltage of the node ZQ is adjusted according to the total resistance of the first pull-up resistor unit 501. Consequently, the voltage of the ZQ voltage is adjusted to match with the reference voltage VREF.

The pull-up code signals PCODE<1:L> are inputted to the second pull-up resistor unit 503 having the same configuration as the first pull-up resistor unit 501. Therefore, the second pull-up resistor unit 503 has the same resistance as the total resistance of the first pull-up resistor unit 501. The comparator 511 compares the voltage of a node A with the reference voltage VREF to generate an up/down signal UP_2/DOWN_2, and the pull-down counter 515 generates the pull-down code signals NCODE<1:L> in response to the up/down signal UP_2/DOWN_2. Consequently, the voltage of the node A is matched with the reference voltage VREF. The ZQ calibration circuit may be designed to generate only the pull-up code signals PCODE<1:L>.

The ZQ calibration circuit compares each of the voltages of the nodes ZQ and A with the reference voltage VREF. Therefore, if the power supply voltage VDD is changed due to the PVT variation and thus the voltages of the nodes ZQ and A are changed, the calibration code signals are also changed. That is, since the calibration code signals contain PVT variation information, the phase mixer 400 in accordance with the embodiment of the present invention can maintain the unit phase value PH_VALUE at a stable or constant value according to the PVT variation in response to the calibration code signals.

According to the circuit design, the ZQ calibration circuit can generate both or one of the pull-up code signals PCODE<1:L> and pull-down code signals NCODE<1:L>. For example, if the ZQ calibration circuit of FIG. 5 includes a first pull-up resistor unit 501, a reference voltage generator 507, a comparator 509 and a pull-up counter 513 in accordance with an embodiment, the ZQ calibration circuit generates only the pull-up code signals PCODE<1:L>.

Figure 6:
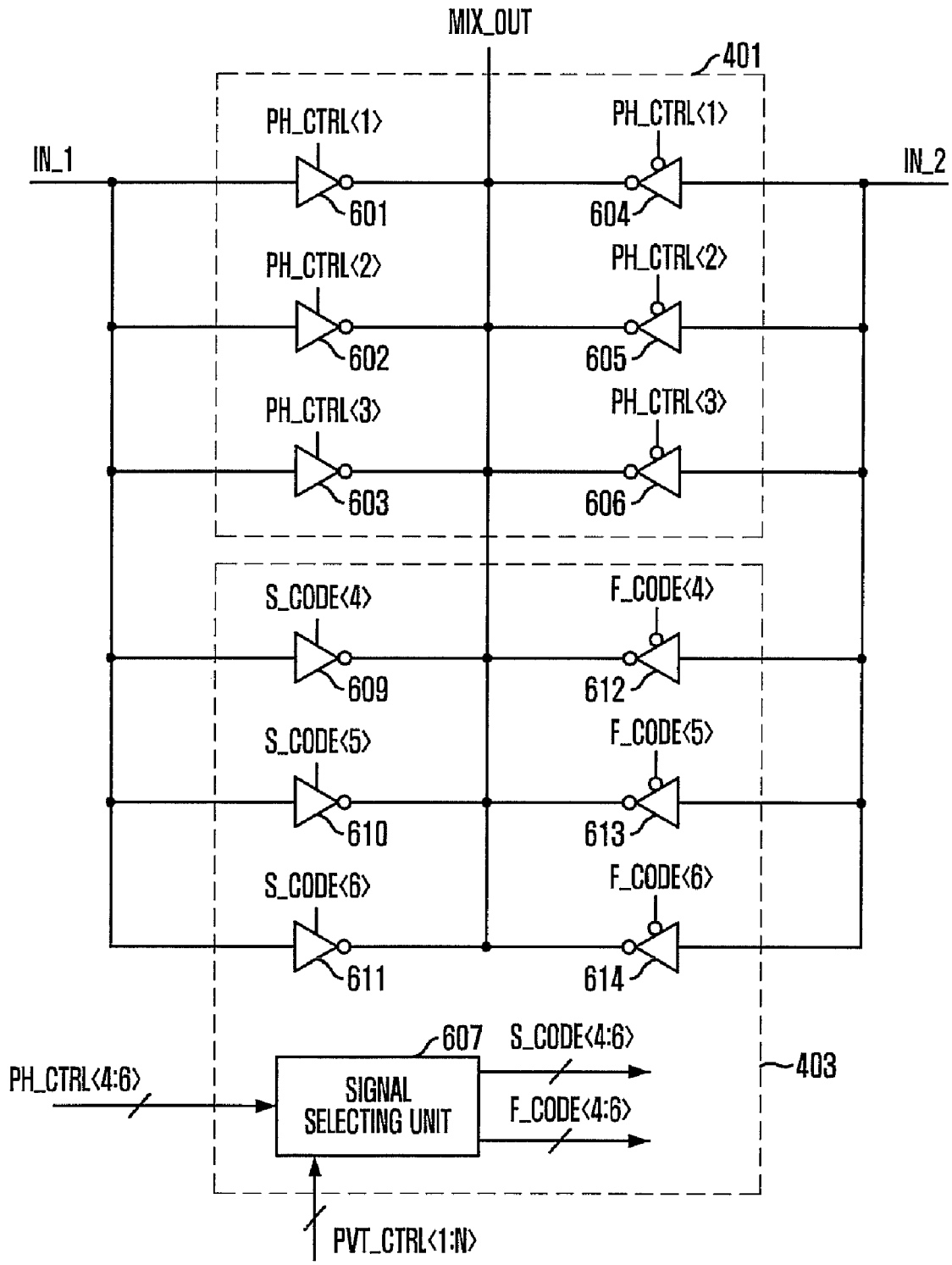
FIG. 6 is a detailed circuit diagram of the phase mixer 400 of FIG. 4.

FIG. 6 is a detailed circuit diagram of the phase mixer 400 of FIG. 4.

In the embodiment of FIG. 6, the phase mixing unit 401 operates in response to the first phase control signals PH_CTRL<1:3> among the phase control signals PH_CTRL<1:K>, and the phase value adjusting unit 403 operates in response to the second phase control signals PH_CTRL<4:6>.

Referring to FIG. 6, the phase mixing unit 401 includes a plurality of first driving units 601 to 603, and a plurality of second driving units 604 to 606. The phase value adjusting unit 403 includes a signal selecting unit 407, a plurality of first additional driving units 609 to 611, and a plurality of second additional driving units 612 to 614.

The first driving units 601 to 603 are enabled or disabled in response to the first phase control signals PH_CTRL<1:3> to adjust the driving strength for the first input signal IN_1. The second driving units 604 to 606 are enabled or disabled in response to the first phase control signals PH_CTRL<1:3> to adjust the driving strength for the second input signal IN_2. That is, the first and second driving units 601 to 606 adjust the driving strengths for the first and second input signals IN_1 and IN_2 to output the phase mixed signal MIX_OUT whose phase is finely varied by the unit phase value PH_VALUE. The first phase control signals PH_CTRL<1:3> correspond to the individual driving units provided in the first driving units 601 to 603 and the second driving units 604 to 606.

The first additional driving units 609 to 611 additionally adjust the driving strength for the first input signal IN_1 in response to first codes SCODE<4:6> which are outputted from the signal selecting unit 607 by decoding the second phase control signals PH_CTRL<4:6>. The second additional driving units 612 to 614 additionally adjust the driving strength for the second input signal IN_2 in response to second codes FCODE<4:6> which are outputted from the signal selecting unit 607 by decoding the second phase control signals PH_CTRL<4:6>. The second phase control signals PH_CTRL<4:6> correspond to the first codes SCODE<4:6> and the second codes FCODE<4:6> and also correspond to the individual driving units provided in the first additional driving units 609 to 611 and the second additional driving units 612 to 614.

As described above, the unit phase value PH_VALUE is determined by the phase difference between the first and second input signals IN_1 and IN_2 and the number of the driving units driving the first and second input signals IN_1 and IN_2. In accordance with the embodiment of the present invention, since the first and second additional driving units 609 to 614 are provided, the number of the driving units driving the first and second input signals IN_1 and IN_2 can be adjusted. Thus, the unit phase value PH_VALUE can be maintained at a stable value by adjusting the number of driving units for driving the first and second input signals IN_1 and IN_2 even though PVT is varied.

The signal selecting unit 607 can determine the number of the additional driving units, which is to be enabled, by decoding the second phase control signals PH_CTRL<4:6> in response to the PVT code signals PVT_CTRL<1:N> to output the first and second codes SCODE<4:6> and FCODE<4:6> having the same bits. That is, since the signal selecting unit 607 decodes the second phase control signals PH_CTRL<4:6>, without directly transferring them to the first and second additional driving units 609 to 614, the number of the additional driving units to be enabled can be determined according to the PVT code signals PVT_CTRL<1:N>. That the additional driving units are enabled means that the additional driving units are turned on/off in response to the first and second codes SCODE<4:6> and FCODE<4:6> so that they adjust the driving strengths for the first and second input signals IN_1 and IN_2. That the additional driving units are disabled means that the additional driving units are always turned off so that they do not drive the first and second input signals IN_1 and IN_2.

In other words, the signal selecting unit 607 decodes the second phase control signals PH_CTRL<4:6> into the first and second codes SCODE<4:6> and FCODE<4:6>, so that only the second phase control signals PH_CTRL<4:6> selected according to the PVT code signals PVT_CTRL<1:N> can enable the first and second additional driving units 609 to 614. For example, the signal selecting unit 607 decodes the second phase control signals PH_CTRL<4:6> so that the logic values of the second phase control signals PH_CTRL<4:5> selected according to the PVT code signals PVT_CTRL<1:N> can be equal to those of the first and second codes SCODE<4:5> and FCODE<4:5>. The signal selecting unit 607 decodes the remaining second phase control signal PH_CTRL<6> into the first and second codes SCODE<6> and FCODE<6> so that the first and second additional driving units 611 and 614 can be disabled.

Hereafter, the detailed operation of the phase mixer 400 will be described below.

The first and second driving units 601 to 606 are turned on/off in response to the first phase control signals PH_CTRL<1:3>, and the first phase control signals PH_CTRL<1:3> inputted to the second driving units 604 to 606 are inverted as shown by the bubbles. Therefore, if the first driving units 601 to 603 receiving the first phase control signals PH_CTRL<1:3> are turned on, the second driving units 604 to 606 receiving the first phase control signals PH_CTRL<1:3> are turned off. As the number of the driving units turned on in response to the first phase control signals PH_CTRL<1:3> increases, the first input signal IN_1 or the second input signal IN_2 is strongly driven. The phase of the phase mixed signal MIX_OUT becomes closer to the phase of the first or second input signal IN_1 or IN_2 which is strongly driven.

Each of the first and second additional driving units 609 to 615 drives the first input signal IN_1 or the second input signal IN_2 and transfers the driven signal to output terminals of the first and second driving units 601 to 606. The first and second additional driving units 609 to 614 are enabled or disabled in response to the first and second codes SCODE<4:6> and FCODE<4:6>, and the second codes FCODE<4:6> inputted to the second additional driving units 612 to 614 are inverted as shown by the bubbles.

The signal selecting unit 607 decodes the second phase control signals PH_CTRL<4:6> according to the PVT code signals PVT_CTRL<1:N> to output the first and second codes SCODE<4:6> and FCODE<4:6>.

For example, when the signal selecting unit 607 selects the second phase control signals PH_CTRL<4:6> in response to the PVT code signals PVT_CTRL<1:N>, the first and second additional driving units 609 to 614 are enabled in response to the first and second codes SCODE<4:6> and FCODE<4:6> to additionally adjust drivabilities for the first and second input signals IN_1 and IN_2. When the signal selecting unit 607 selects the second phase control signal PH_CTRL<4> in response to the PVT code signals PVT_CTRL<1:N>, the first and second additional driving units 609 and 612 are enabled in response to the first and second codes SCODE<4> and FCODE<4> to additionally adjust driving strengths for the first and second input signals IN_1 and IN_2. Meanwhile, the first and second additional driving units 610, 611, 613 and 614 are disabled in response to the first and second codes SCODE<5:6> and FCODE<5:6>.

The maximum values of the driving strengths for the first and second input signals IN_1 and IN_2 are increased by the number of the enabled additional driving units, and the phase difference between the first and second input signals IN_1 and IN_2 can be adjusted more finely. Therefore, even though the phase difference between the first and second input signals IN_1 and IN_2 increases due to the PVT variation, the unit phase value PH_VALUE may be prevented from increasing by use of the additional driving units.

Meanwhile, the number of the additional first and second driving units 609 to 614 may be changed according to designs.

Figure 7:
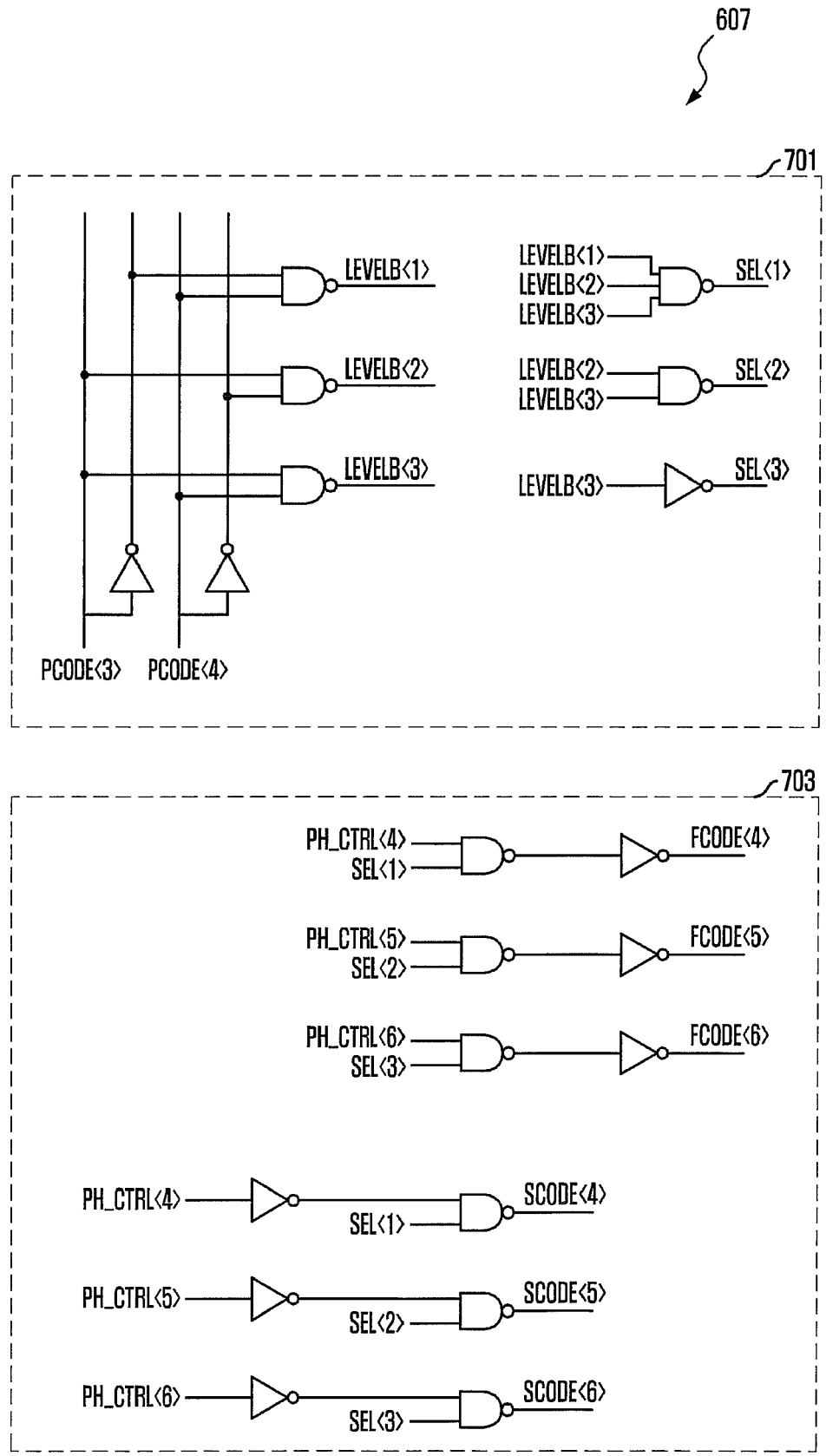
FIG. 7 is a detailed circuit diagram of a signal selecting unit 607 of FIG. 6.

FIG. 7 is a detailed circuit diagram of the signal selecting unit 607 of FIG. 6.

Referring to FIG. 7, the signal selecting unit 607 includes a selection signal generating unit 701 and a decoding unit 703.

Specifically, FIG. 7 illustrates an embodiment in which the signal selecting unit 607 decodes the second phase control signals PH_CTRL<4:6> in response to the pull-up code signals PCODE<3:4> generated from the ZQ calibration circuit of FIG. 5, and outputs the first and second codes SCODE<4:6> and FCODE<4:6>.

The selection signal generating unit 701 decodes the pull-up code signals PCODE<3:4> to generate selection signals SEL<1:3>. The selection signals SEL<1:3> are inputted to the decoding unit 703 outputting the first and second codes SCODE<4:6> and FCODE<4:6>. The number of the additional driving units enabled is determined according to the selection signals SEL<1:3>. For example, when the initial pull-up code signals PCODE<3:4> are changed from "00" to "10", "01" and "11" according to the PVT variation, the selection signals SEL<1:3> generated from the selection signal generating unit 701 of FIG. 7 are changed from "000" to "001", "011" and "111".

The decoding unit 703 decodes the second phase control signals PH_CTRL<4:6> into the first and second codes SCODE<4:6> and FCODE<4:6> according to the selection signals SEL<1:3>. For example, when the selection signal SEL<1> is activated to a high level and the selection signals SEL<2:3> are activated to a low level, logic values of the first and second codes SCODE<4> and FCODE<4> are changed according to logic values of the second phase control signal PH_CTRL<4>, and the first and second codes SCODE<4> and FCODE<4> control the on/off operations of the first and second additional driving units 609 and 612. The logic values of the first and second codes SCODE<5:6> and FCODE<5:6> maintain a constant value, regardless of the logic values of the second phase control signals PH_CTRL<6:8>. That is, the first codes SCODE<5:6> are maintained at a low level, and the second codes FCODE<5:6> are maintained at a high level. Therefore, the first and second additional driving units 610, 611, 613 and 614 are all turned off, that is, disabled by the first and second codes SCODE<5:6> and FCODE<5:6>, so that the first and second input signals IN_1 and IN_2 are not driven.

In other words, the signal selecting unit 607 can selectively transfer the second phase control signals PH_CTRL<4:6> according to the PVT code signals PVT_CTRL<1:N>, and only the additional driving units corresponding to the selected second phase control signals are enabled.

Figure 8:
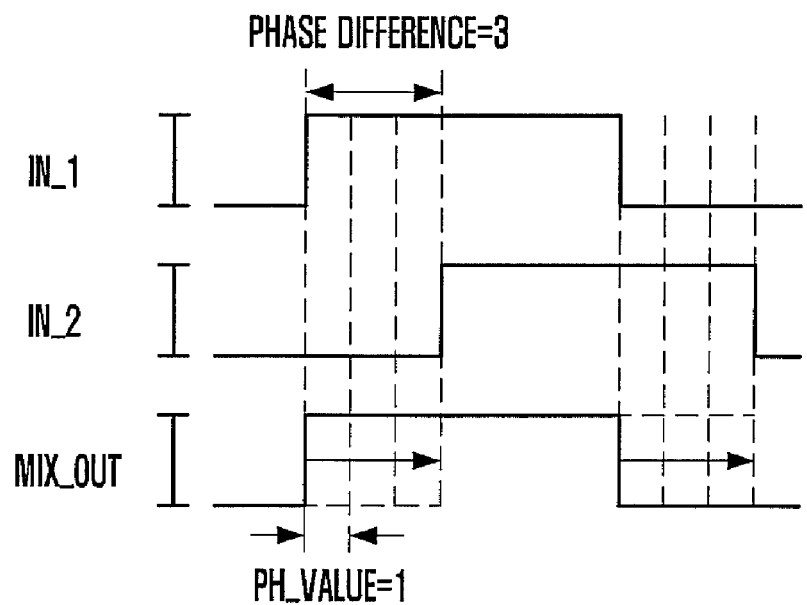
FIG. 8 is a timing diagram for explaining the operation of the phase mixer 400 of FIG. 6.
Figure 8:
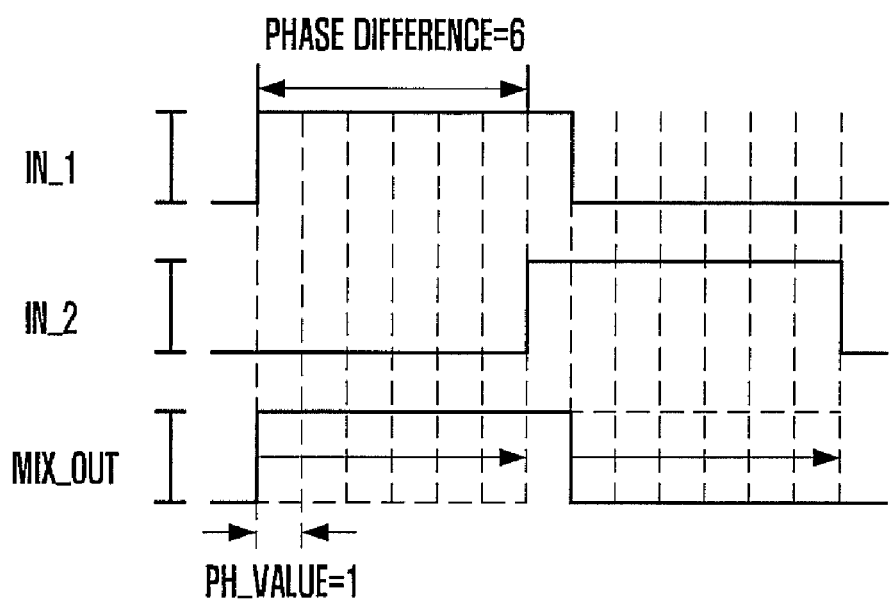

FIG. 8 is a timing diagram for explaining the operation of the phase mixer 400 of FIG. 6.

Referring to FIG. 8, the phase mixing unit 401 of FIG. 6 includes three first driving units 601 to 603 and three second driving units 604 to 606, and the phase value adjusting unit 403 includes three first additional driving units 609 to 611 and three second additional driving units 612 and 614. Also, the phase of the phase mixed signal MIX_OUT is varied by the unit phase value PH_VALUE.

When the first and second additional driving units 609 to 614 are all disabled prior to the PVT variation and the phase difference between the first and second input signals IN_1 and IN_2 is 3, the number of the first driving units 601 to 603 and the second driving units 604 to 606 driving the first and second input signals IN_1 and IN_2 is 3, so that the unit phase value PH_VALUE is 1.

When the phase difference between the first and second input signals IN_1 and IN_2 increases to 6 due to the PVT variation, the phase value adjusting unit 403 enables some or all of the first and second additional driving units 609 to 614 in response to the PVT code signals PVT_CTRL<1:4>. The unit phase value PH_VALUE can be maintained stably at "1" when the first and second additional driving units 609 to 614 are all enabled to additionally adjust the driving strengths for the first and second input signals IN_1 and IN_2.

Figure 9:
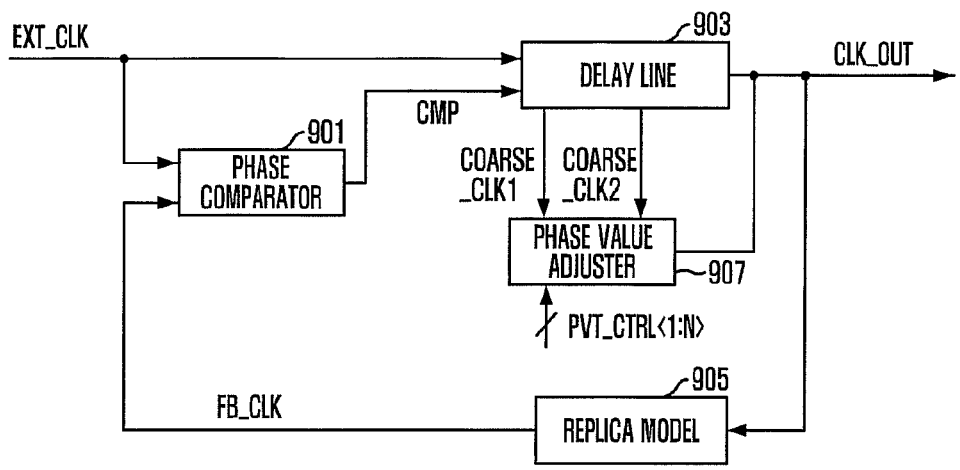
FIG. 9 is a block diagram of a delay locked loop in accordance with an embodiment of the present invention.

FIG. 9 is a block diagram of a delay locked loop in accordance with an embodiment of the present invention.

Referring to FIG. 9, the delay locked loop in accordance with the embodiment of the present invention includes a phase comparator 901, a delay line 903, a replica model 905, and a phase value adjuster 907. The phase value adjuster 907 corresponds to the phase value adjusting unit 403 of FIG. 4. Here, a fine delay value FINE_DD corresponds to the unit phase value PH_VALUE.

The phase comparator 901 compares a phase of an external clock EXT_CLK with a phase of a feedback clock FB_CLK outputted from the replica model 905, and outputs a comparison signal CMP containing information on a phase difference between the external clock EXT_CLK and the feedback clock FB_CLK. The replica model 905 stores values modeling clock delay components of a semiconductor device (for example, a semiconductor device to which the replica model 906 form a part of or to which the CLK_OUT is supplied) or replicates PVT variations of components of the semiconductor device, and may output the feedback clock FB_CLK reflecting PVT variations of the semiconductor device, and receives an internal clock CLK_OUT to output the feedback clock FB_CLK. The delay line 903 outputs the internal clock CLK_OUT by delaying the external clock EXT_CLK by a coarse delay value COARSE_DD or a fine delay value FINE_DD, which is less than the coarse delay value COARSE_DD, in response to the comparison signal CMP in order to reduce the phase difference between the external clock EXT_CLK and the feedback clock FB_CLK. The clock is locked when the phase difference between the external clock EXT_CLK and the feedback clock FB_CLK cannot be further reduced.

More specifically, in order to rapidly reduce the phase difference between the external clock EXT_CLK and the feedback clock FB_CLK, the delay line 903 delays the external clock EXT_CLK by the coarse delay value COARSE_DD having a relatively large delay value to generate first and second coarse delay clocks COARSE_CLK1 and COARSE_CLK2. The delay line 903 mixes the phases of the first and second coarse delay clocks COARSE_CLK1 and COARSE_CLK2 to thereby finely adjust the phase difference between the external clock EXT_CLK and the feedback clock FB_CLK by the fine delay value FINE_DD. The delay line 903 will be described later in more detail with reference to FIG. 10.

The phase value adjuster 907 adjusts the fine delay value FINE_DD by additionally adjusting the driving strengths for the first and second coarse delay clocks COARSE_CLK1 and COARSE_CLK2 according to PVT code signals PVT_CTRL<1:N> containing the PVT variation information. In accordance with the embodiment of the present invention, the delay line 903 of the delay locked loop includes a fine delay unit 1005 (see FIG. 10) corresponding to the phase mixer 401 of FIG. 4 in order to delay the external clock EXT_CLK by the fine delay value FINE_DD. The phase value adjuster 907 maintains the fine delay value FINE_DD at a stable or constant value in response to the PVT code signals PVT_CTRL<1:N> even when the PVT varies. Therefore, after the clock locking, it is possible to prevent the phase difference between the external clock EXT_CLK and the feedback clock FB_CLK from being increased due to the PVT variation. Consequently, it is possible to eliminate jitter that may be generated by the increased delay value.

Figure 10:
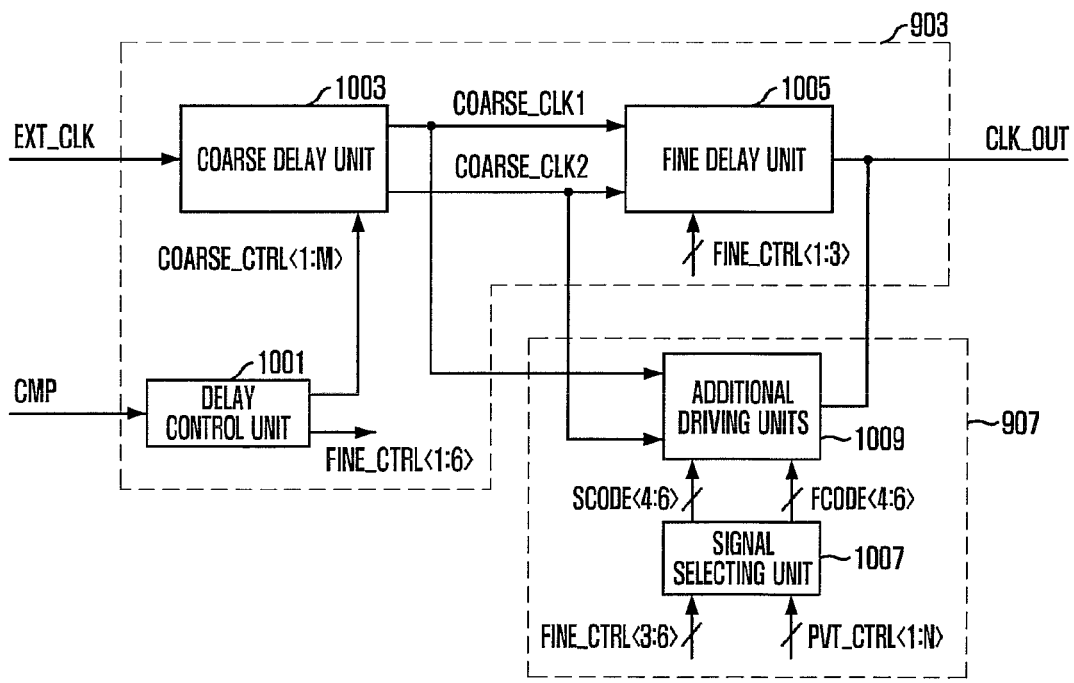
FIG. 10 is a detailed block diagram illustrating a delay line 903 and a phase value adjuster 907.

FIG. 10 is a detailed block diagram illustrating the delay line 903 and the phase value adjuster 907.

Referring to FIG. 10, the delay line 903 includes a delay control unit 1001, a coarse delay unit 1003, and a fine delay unit 1005. The phase value adjuster 907 includes a signal selecting unit 1007 and a plurality of additional driving units 1009. The signal selecting unit 1007 corresponds to the signal selecting unit of FIG. 6, and the plurality of additional driving units 1009 correspond to the first and second additional driving units 609 to 614 of FIG. 6.

Specifically, FIG. 10 illustrates an embodiment in which the delay control unit 1001 generates fine delay control signals FINE_CTRL<1:6>, the fine delay unit 1005 operates in response to the fine delay control signals FINE_CTRL<1:3>, and the phase value adjuster 907 operates in response to the fine delay control signals FINE_CTRL<4:6>.

The delay control unit 1001 outputs coarse delay control signals COARSE_CTRL<1:M> determining the coarse delay value COARSE_DD, and fine delay control signals FINE_CTRL<1:6> determining the fine delay value FINE_DD. When the delay locked loop does not include the phase value adjuster 907, the delay control unit 1001 is configured to generate the fine delay control signals FINE_CTRL<1:3>. However, when the delay locked loop includes the phase value adjuster 907, the delay control unit 1001 is configured to further generate the fine delay control signals FINE_CTRL<4:6>. The fine delay control signals FINE_CTRL<1:6> are generated in response to the comparison signal CMP. Bit number of the fine delay control signals FINE_CTRL<1:6> can be adjusted based on the driving units of the fine delay unit 1005 and the plurality of additional driving units 1009 included in the phase value adjuster 907.

The coarse delay unit 1003 includes a plurality of delay units configured to each delay the input signal by the unit delay value UNIT_DD. The coarse delay unit 1003 delays the external clock EXT_CLK by the coarse delay value COARSE_DD in response to the coarse delay control signals COARSE_CTRL<1:M> to output the first and second coarse delay clocks COARSE_CLK1 and COARSE_CLK2 having a phase difference corresponding to a natural number of the unit delay unit UNIT_DD. The coarse delay value COARSE_DD may be two times the unit delay value UNIT_DD. The first and second coarse delay clocks COARSE_CLK1 and COARSE_CLK2 correspond to the first and second input signals IN_1 and IN_2 of FIG. 4.

As described above, the fine delay unit 1005 corresponds to the phase mixer 401 of FIG. 4, and is configured with a plurality of driving units driving the first and second coarse delay clocks COARSE_CLK1 and COARSE_CLK2, for example, the first and second driving units 601 to 606 of FIG. 6. The fine delay unit 1005 mixes the phases of the first and second coarse delay clocks COARSE_CLK1 and COARSE_CLK2 in response to the fine delay control signals FINE_CTRL<1:3> to output the internal clock CLK_OUT delayed by the fine delay value FINE_DD. The fine delay control signals FINE_CTRL<1:3> correspond to the first phase control signals PH_CTRL<1:3>.

The plurality of additional driving units 1009 driving the first and second coarse delay clocks COARSE_CLK1 and COARSE_CLK2 to output the driven clocks to the output terminals of the fine delay unit 1005 are enabled or disabled in response to the first and second codes SCODE<4:6> and FCODE<4:6> outputted from the signal selecting unit 1007.

As described above, the signal selecting unit 1007 decodes the fine control signals FINE_CTRL<4:6> in response to the PVT code signals PVT_CTRL<1:N> to output the first and second codes SCODE<4:6> and FCODE<4:6>. At this point, the signal selecting unit 1007 selects some or all of the fine delay control signals FINE_CTRL<4:6> in response to the PVT code signals PVT_CTRL<1:N> to enable some or all of the additional driving units 1009.

When the driving units of the fine delay unit 1005 and the plurality of additional driving units 1009 are configured with inverters, the internal clock CLK_OUT outputted from the delay line 903 may be inverted by an inverter.

Meanwhile, when the internal clock CLK_OUT cannot be further delayed by the fine delay value FINE_DD prior to the locking, the delay line 903 adjusts the delay values of the first and second coarse clocks COARSE_CLK1 and COARSE_CLK2, which will be described in detail with reference to FIG. 11.

Figure 11:
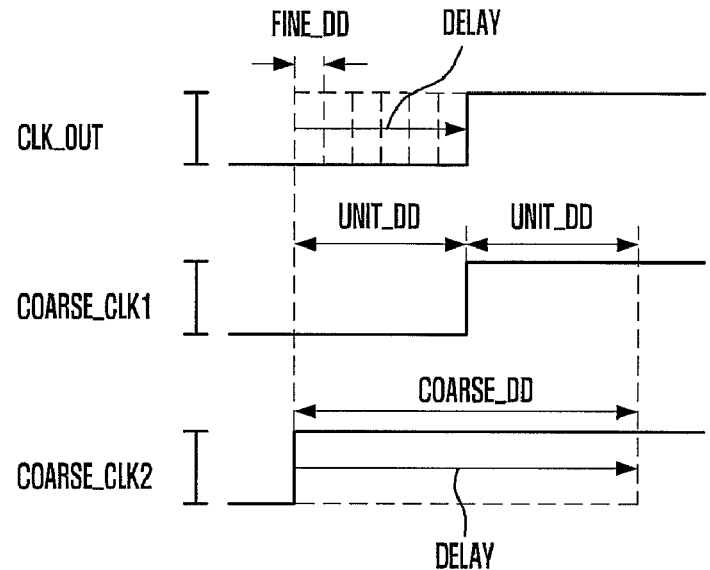
FIG. 11 is a timing diagram for explaining a case where an internal clock CLK_OUT cannot be delayed any more.

FIG. 11 is a timing diagram for explaining a case where the internal clock CLK_OUT cannot be delayed any more.

Specifically, FIG. 11 illustrates a case where the driving strength for the first coarse delay clock COARSE_CLK1 becomes gradually strong, the driving strength for the second coarse delay clock COARSE_CLK2 becomes gradually weak, and the plurality of additional driving units 1009 are all enabled.

As the driving strength for the first coarse delay clock COARSE_CLK1 becomes stronger, the internal clock CLK_OUT is delayed by the fine delay value FINE_DD, as indicated by dotted lines. Thereafter, when the driving units and the plurality of additional driving units driving the first coarse delay clock COARSE_CLK1 are all turned on, the phase of the internal clock CLK_OUT is matched with that of the first coarse delay clock COARSE_CLK1 and the internal clock CLK_OUT cannot be further delayed by the fine delay value FINE_DD, as indicated by solid lines.

In order to further delay the internal clock CLK_OUT by the fine delay value FINE_DD, it is necessary to adjust the delay values of the first and second coarse delay clocks COARSE_CLK1 and COARSE_CLK2. That is, as indicated by the dotted lines, after the second coarse delay clock COARSE_CLK2 is further delayed by the coarse delay value COARSE_DD, the driving strength for the second coarse delay clock COARSE_CLK2 is increased and the driving strength for the first coarse delay clock COARSE_CLK1 is reduced. In this way, the internal clock CLK_OUT can be further delayed by the fine delay value FINE_DD.

In case where the fine delay control signals FINE_CTRL<1:6> are sequentially activated from the least significant bit signal FINE_CTRL<1> to the most significant bit signal FINE_CTRL<6>, if the most significant bit signal FINE_CTRL<6> among the fine delay control signals FINE_CTRL<1:6> is activated, the driving units and the plurality of additional driving units driving the first coarse delay clock COARSE_CLK1 are all turned on so that the internal clock CLK_OUT is not delayed any more. Therefore, the delay control unit 1001 increases the delay value of the second coarse delay clock COARSE_CLK1 in response to an activation (for example, turning to a bit value of 1) of the most significant bit signal FINE_CTRL<6> among the fine delay control signals FINE_CTRL<1:6>.

In other words, the most significant bit signal means a most significant bit signal among the fine delay control signals corresponding to the driving unit and the plurality of additional driving units adjusting the drivability for the input signal.

For example, when the plurality of additional driving units 1009 are all disabled, FINE_CTRL<3> becomes the most significant bit signal that is activated. When all or some of the plurality of additional driving units 1009 are enabled, one of the fine delay control signals FINE_CTRL<4:6> becomes the most significant bit signal that is activated. Therefore, the signal selecting unit 1007 transfers the fine delay control signal FINE_CTRL<3> as the most significant bit signal that is activated when the plurality of additional driving units 1009 are all disabled according to the PVT code signals PVT_CTRL<1:N>, and transfers one of the fine delay control signals FINE_CTRL<4:6> as the most significant bit signal that is activated when all or some of the plurality of additional driving units 1009 are enabled.

Meanwhile, on the contrary, there may exist a case where the delay value of the internal clock CLK_OUT tunable by the fine delay value FINE_DD has reached a maximum allowed limit. In a state that the fine delay control signals FINE_CTRL<1:6> are enabled so that the phase of the first coarse delay clock COARSE_CLK1 is synchronized with that of the internal clock CLK_OUT, if the fine delay control signals are sequentially deactivated from the most significant bit signal FINE_CTRL<6> to the least significant bit signal FINE_CTRL<1> so that the driving strength for the first coarse delay clock COARSE_CLK1 becomes weaker, the delay value of the internal clock CLK_OUT is not reduced any more when the least significant bit signal FINE_CTRL<1> is deactivated.

In this case, after the delay value of the first coarse delay clock COARSE_CLK1 is reduced by the coarse delay value COARSE_DD, the driving strength for the second coarse delay clock COARSE_CLK2 is reduced. Then, when the driving strength for the first coarse delay clock COARSE_CLK1 is increased, the delay value of the internal clock CLK_OUT can be reduced by the fine delay value FINE_DD.

Therefore, the delay control unit 1001 reduces the delay value of the first coarse delay clock COARSE_CLK1 by the coarse delay value COARSE_DD in response to the least significant bit signal FINE_CTRL<1> among the fine delay control signals FINE_CTRL<1:6>.

Figure 12:
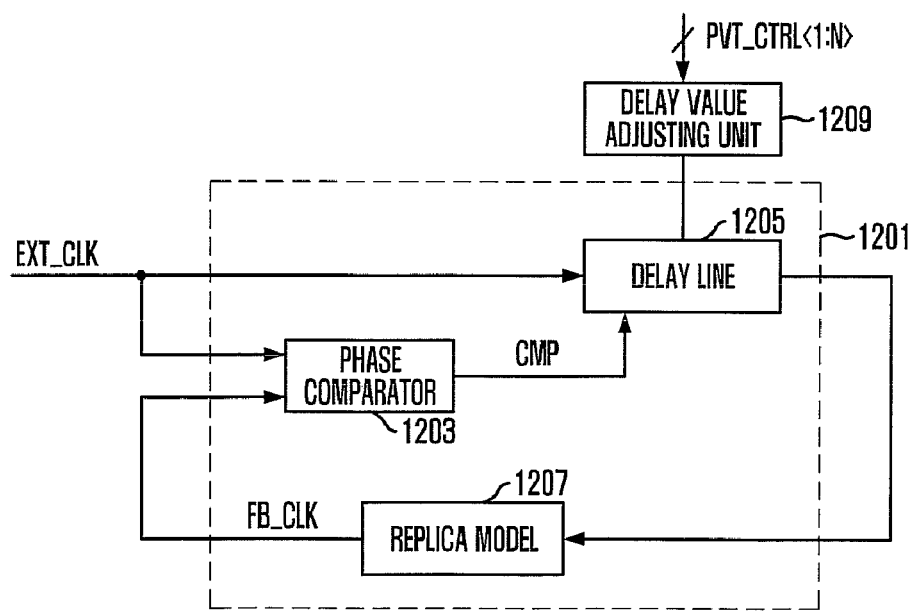
FIG. 12 is a block diagram of a delay locked loop in accordance with another embodiment of the present invention.

FIG. 12 is a block diagram of a delay locked loop in accordance with another embodiment of the present invention.

Referring to FIG. 12, the delay locked loop includes a delay locking unit 1201 and a delay value adjusting unit 1209. The delay locking unit 1201 delays an input clock by a natural number of unit delay value UNIT_DD in order to compensate for a skew between an external clock EXT_CLK and an internal clock CLK_OUT. The delay value adjusting value 1209 adjusts the unit delay value UNIT_DD according to a PVT code signal PVT_CTRL<1:N> containing PVT variation information. The input clock may be the external clock EXT_CLK or a buffered external clock.

The delay locking unit 1201 includes a phase comparator 1203, a delay line 1205, and a replica model 1207.

The operation of the delay locked loop of FIG. 12 is similar to that of the delay locked loop of FIG. 9. However, the delay locked loop of FIG. 12 differs from the delay locked loop of FIG. 9 in that the external clock EXT_CLK is delayed by the unit delay value UNIT_DD. The operation of the delay line 1205 and the delay value adjusting unit 1209 will be described below with reference to FIG. 13.

Figure 13:
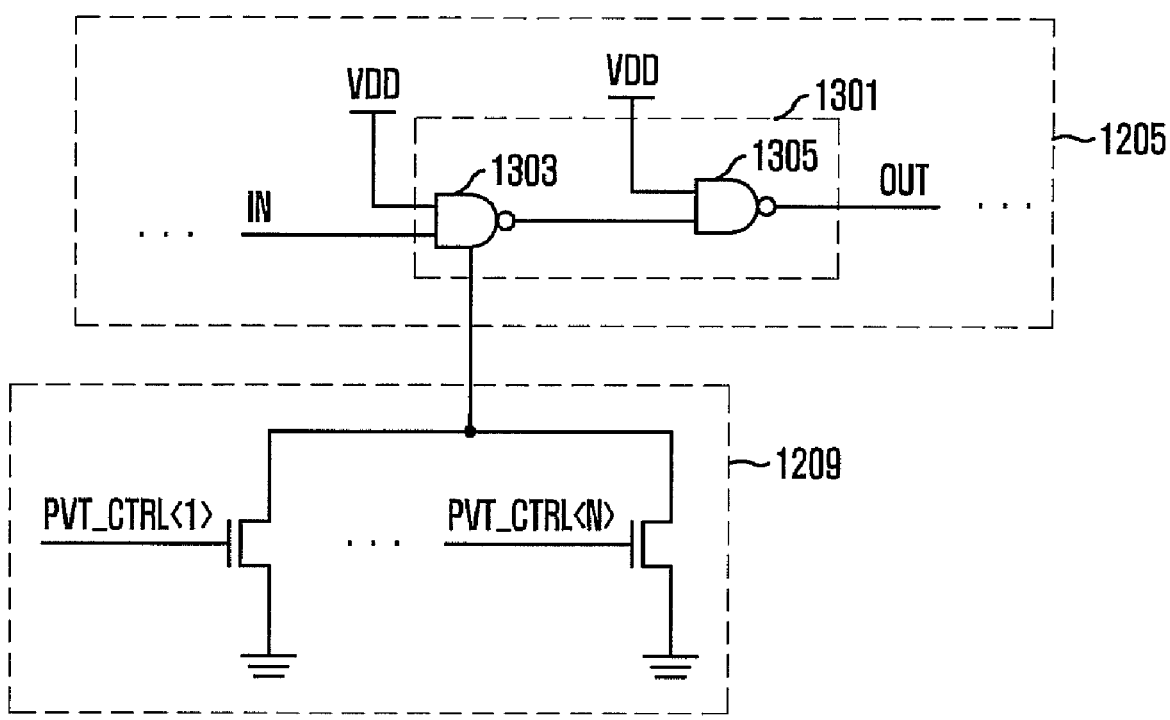
FIG. 13 is a circuit diagram of a delay line 1205 and a delay value adjusting unit 1209 of FIG. 12.

FIG. 13 is a circuit diagram of the delay line 1205 and the delay value adjusting unit 1209 of FIG. 12.

Referring to FIG. 13, the delay line 1205 may include a delay unit 1301 delaying an input signal by the unit delay value UNIT_DD. The delay unit 1301 may be configured with a plurality of NAND gates 1303 and 1305.

The delay value adjusting unit 1209 may be configured with a plurality of NMOS transistors connected in parallel. The delay value adjusting unit 1209 adjusts the unit delay value UNIT_DD by controlling a current flowing through the delay unit 1301 of the delay line 1205 in response to the PVT code signals PVT_CTRL<1:N>. The delay value adjusting unit 1209 may be configured with switching elements turning on/off in response to the PVT code signals PVT_CTRL<1:N> according to design. In accordance with the embodiment of FIG. 13, the switching elements are configured with NMOS transistors.

The unit delay value UNIT_DD increases due to the PVT variation, for example, when the power supply voltage VDD driving the delay unit 1301 drops. In this case, the delay value adjusting unit 1209 can prevent increase of the unit delay value UNIT_DD by increasing the current flowing through the delay unit 1301.

Each of the NMOS transistors constituting the delay value adjusting unit 1209 have one terminal connected to the NAND gate 1303, and another terminal connected to the ground voltage terminal. The NMOS transistors are turned on/off in response to the PVT code signals PVT_CTRL<1:N>. That is, the number of the NMOS transistors to be turned on is changed according to the PVT code signals PVT_CTRL<1:N>. As the number of the turned-on NMOS transistors increases, the path through which the current can flow increases.

In accordance with the embodiments of the present invention, the current flowing through the delay unit 1301 can be controlled according to the PVT variation, and the increase of the unit delay value UNIT_DD can be prevented. Consequently, even though the unit delay value UNIT_DD increases due to the PVT variation, the unit delay value UNIT_DD is maintained at an originally intended value, thereby preventing the increase of the phase difference between the external clock EXT_CLK and the feedback clock FB_CLK. Furthermore, it is possible to prevent the increase of jitter which may be generated by the increased delay value.

Although not shown, the delay line 1205 may further include another delay unit connected in series to the delay unit 1301, and the delay value adjusting unit 1209 controls the current flowing through the plurality of delay units.

In accordance with the embodiments of the present invention, if the phase of a clock is adjusted by a natural number of a phase value that is proportionally increased according to PVT variations, the phase value is adjusted using the PVT code signals containing PVT variation information. Thus, the phase of the clock may be adjusted with the phase value, without increasing jitters.

While the present invention has been described with respect to the specific embodiments, it will be apparent to those skilled in the art that various changes and modifications may be made without departing from the spirit and scope of the invention as defined in the following claims.

What is claimed is:

1. A phase mixer, comprising:
   a phase mixing unit configured to mix a phase of a first input signal and a phase of a second input signal in response to a phase control signal and output a phase mixed signal whose phase is varied by one or more units of a unit phase value; and
   a phase value adjusting unit configured to control an operation of the phrase mixing unit so that the unit phase value is adjusted in response to a code signal coding at least one of a process, voltage, or temperature (PVT) variation.

2. The phase mixer of claim 1, wherein the PVT code signal includes a calibration code signal generated by a calibration circuit which includes:
   a plurality of resistor circuits connected in parallel to a node, in each of which a reference resistor is connected to, and turned on/off in response to the calibration code signal, wherein a reference resistor is connected to the node;
   a comparator configured to compare a reference voltage and a voltage on the node; and
   a pull-up counter configured to generate the calibration code signal in response to an output of the comparator.

3. The phase mixer of claim 1, wherein the phase mixing unit comprises a plurality of driving units configured to be turned on or off in response to the phase control signal to adjust driving strengths of the phase mixing unit for the first and second input signals and the phase value adjusting unit is configured to additionally adjust the driving strengths in response to the PVT code signal and the phase control signal.

4. The phase mixer of claim 3, wherein the unit phase value is reduced so that a maximum value of the driving strengths increases.

5. The phase mixer of claim 3, wherein the phase value adjusting unit comprises:
   a signal selecting unit configured to select a portion of the phase control signal having a plurality of bit signals in response to the PVT code signal; and
   a plurality of additional driving units configured to be turned on or off in response to the phase control signal selected by the signal selecting unit to additionally adjust the driving strengths for the first and second input signals.

6. A delay locked loop, comprising:
a phase comparator configured to compare a phase of an external clock with a phase of a feedback clock to output a comparison signal;
a delay line configured to output an internal clock by delaying the external clock in response to the comparison signal;
a replica model configured to receive the internal clock to output the feedback clock; and
a phase value adjuster configured to control an operation of the delay line so that the delay value of the delay line is adjusted in response to a code signal coding a process, voltage, and temperature (PVT) variation.

7. The delay locked loop of claim 6, wherein the PVT code signal includes a calibration code signal generated by a calibration circuit which includes:
a plurality of resistor circuits connected in parallel to a node and turned on/off in response to the calibration code signal, wherein a reference resistor is connected to the node;
a comparator configured to compare a reference voltage, generated by a reference voltage generator, and a voltage on the node; and
a pull-up counter configured to generate the calibration code signal in response to an output of the comparator.

8. The delay locked loop of claim 6, wherein the delay line comprises:
a delay control unit configured to output a coarse delay control signal and a fine delay control signal in response to the comparison signal;
a coarse delay unit configured to delay the external clock by a coarse delay value in response to the coarse delay control signal to output first and second coarse delay clocks; and
a fine delay unit configured to mix a phase of the first coarse delay clock and a phase of the second coarse delay clock in response to the fine delay control signal to output the internal clock delayed by a fine delay value which is less than the coarse delay value.

9. The delay locked loop of claim 8, wherein the fine delay unit comprises a plurality of driving units configured to be turned on or off in response to the fine delay control signal to adjust driving strengths for the first and second coarse delay clocks, and the phase value adjuster additionally adjusts the driving strengths in response to the PVT code signal and the fine delay control signal.

10. The delay locked loop of claim 9, wherein the fine delay value decreases as a maximum value of the driving strengths increases.

11. The delay locked loop of claim 9, wherein the phase value adjuster comprises:
a signal selecting unit configured to select some bit signals of the fine delay control signal having a plurality of bit signals in response to the PVT code signal; and a plurality of additional driving units configured to be turned on or off in response to the fine delay control signal selected by the signal selecting unit to additionally drive the first and second coarse delay clocks.

12. The delay locked loop of claim 11, wherein the coarse delay unit adjusts a delay value of one of the first coarse delay clock and the second coarse delay clock by the coarse delay value when a phase of the internal clock is matched with that of the other of the first coarse delay clock and the second coarse delay clock.

13. The delay locked loop of claim 12, wherein the coarse delay unit adjusts the delay value in response to a most significant bit signal of the fine delay control signal selectively activated by the signal selecting unit.

14. A delay locked loop, comprising:
a delay locking unit configured to delay an input clock by one or more units of a unit delay value in order to compensate for a skew between an external clock and an internal clock; and
a delay value adjusting unit configured to adjust the unit delay value at a desired value according to a code signal coding at least one of a process, voltage, and temperature (PVT) variation,
wherein the delay locking unit comprises:
a phase comparator configured to compare a phase of the input clock with a phase of a feedback clock to output a comparison signal;
a delay line configured to delay the input clock by the one or more units of the unit delay value in response to the comparison signal; and
a replica model configured to receive an output signal of the delay line to output the feedback clock.

15. The delay locked loop of claim 14, wherein the PVT code signal includes a calibration code signal generated by a calibration circuit which includes:
a plurality of resistor circuits connected in parallel to a node and turned on/off in response to the calibration code signal, wherein a reference resistor is connected to the node;
a comparator configured to compare a reference voltage, generated by a reference voltage generator, and a voltage on the node; and
a pull-up counter configured to generate the calibration code signal in response to an output of the comparator.

16. The delay locked loop of claim 14 wherein the delay line comprises a plurality of delay units delaying an input signal by the one or more units of the unit delay value and the delay value adjusting unit controls a current flow flowing through the plurality of delay units.

17. The delay locked loop of claim 16, wherein the delay value adjusting unit comprises a plurality of switching elements connected between a power supply and a ground and configured to be turned on or off in response to the PVT code signal.

* * * * *